United States Patent
Kurd et al.

(10) Patent No.: US 7,342,426 B2
(45) Date of Patent: Mar. 11, 2008

(54) PLL WITH CONTROLLED VCO BIAS

(75) Inventors: Nasser A. Kurd, Portland, OR (US); Javed S. Barkatullah, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/218,207

(22) Filed: Aug. 31, 2005

(65) Prior Publication Data

US 2007/0046343 A1    Mar. 1, 2007

(51) Int. Cl.
    *H03L 7/06* (2006.01)
(52) U.S. Cl. ...................... 327/156; 327/117
(58) Field of Classification Search .......... None
    See application file for complete search history.

(56) References Cited

U.S. PATENT DOCUMENTS

| | | | |
|---|---|---|---|
| 5,155,451 A * | 10/1992 | Gladden et al. ............ 331/1 A |
| 5,764,711 A * | 6/1998 | Jokura ...................... 375/376 |
| 5,847,617 A * | 12/1998 | Reddy et al. ................ 331/57 |
| 6,040,828 A * | 3/2000 | Park ........................ 345/213 |
| 6,271,730 B1 * | 8/2001 | Abe et al. .................. 331/34 |
| 6,310,523 B1 * | 10/2001 | Chen et al. ................. 331/57 |
| 6,310,928 B1 * | 10/2001 | Yunome .................... 375/376 |
| 6,370,603 B1 * | 4/2002 | Silverman et al. ........... 710/72 |
| 6,400,957 B1 * | 6/2002 | Rodrigues et al. .......... 455/462 |
| 6,670,833 B2 | 12/2003 | Kurd et al. |
| 7,061,223 B2 * | 6/2006 | Boerstler et al. ....... 324/76.53 |

* cited by examiner

*Primary Examiner*—N. Drew Richards
*Assistant Examiner*—An T. Luu

(57) ABSTRACT

In some embodiments, a PLL with an output to provide a PLL output clock at a target frequency is provided. The PLL comprises a VCO to generate a clock to be used to generate the PLL output clock. Also provided is circuitry to maintain the VCO's bias level at a sufficient level if it is insufficient. Other embodiments may be disclosed herein.

11 Claims, 3 Drawing Sheets

PLL WITH CONTROLLED VCO BIAS

BACKGROUND

Embodiments of the invention relate generally to phase locked loop (PLL) circuits and in particular to PLL circuits with voltage controlled oscillator (VCO) circuits having controllable (or maintainable) biasing.

PLL circuits are used to control the frequency and/or phase of a clock signal. They typically have a voltage controlled oscillator (VCO) circuit for controlling a signal's frequency based on the value of an input signal such as an input voltage. The performance of a PLL may depend on the performance capability of the VCO and its immunity to distortion such as thermal noise. Accordingly, improved PLL designs less sensitive to noise are desired.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

PLLs are commonly used in microprocessors to generate relatively high clock frequencies. PLLs generally include a VCO to generate a clock signal having a frequency controlled by the value of an input control signal (e.g., control voltage). Depending on the operating conditions and operating frequency, the bias strength within the VCO may be relatively weak (e.g., when the output frequency is to be on the low end of the VCO's operating range). Unfortunately, this can make the VCO (and possibly other components such as a charge pump) more sensitive to noise and thus increase clock inaccuracies as phase error and jitter will tend to increase. With different embodiments disclosed herein, the VCO is controlled to operate at sufficient bias levels over at least a portion of its frequency range to make it less sensitive to noise. As will be discussed herein, this may be achieved in different ways—especially depending upon the configuration of a given PLL circuit.

Figure 1:
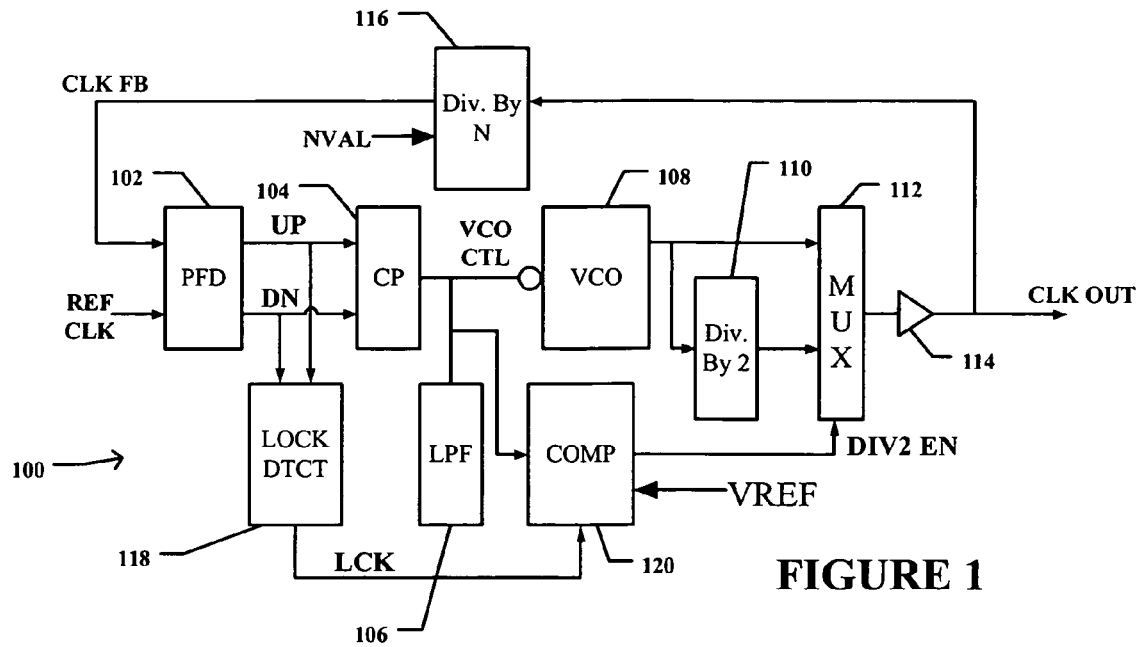
FIG. 1 is a block diagram of a PLL with controlled VCO biasing according to some embodiments.

FIG. 1 shows a block diagram of a PLL 100 with bias control in accordance with some embodiments. The PLL circuit receives at its input a reference clock (REF CLK) and generates at its output (CLK OUT) a PLL clock output signal that tracks the reference clock signal. The depicted PLL 100 generally comprises a phase-frequency detector (PFD) 102, charge pump 104, low pass filter (LPF) 106, VCO 108, divide-by-2 circuit 110, 2:1 multiplexer (MUX) 112, output buffer 114, divide-by-N circuit 116, lock detector 118, and comparator 120. The PFD 102, CP 104, LPF 106, VCO 108, divide-by-2 circuit 110, MUX 112, output buffer 114, and divide-by-N circuit 116 form a closed control loop for generating the output clock signal aligned with the reference clock but with a frequency that is N times greater (where N is the set integer value of the divide-by-N circuit 116). The lock detector 118 and comparator 120 serve to engage (if necessary) the divide-by-2 circuit 110 to increase the VCO bias level.

The PFD 102 receives the CLK REF input, along with a clock feedback (CLK FB) signal from the generated clock output (by way of the divide-by-N circuit 116). It is coupled to the charge pump 104 providing it with digital up (UP) and down (DN) signals indicating whether the CLK FB signal leads, lags, or is locked with the REF CLK signal. In the depicted embodiment, the UP signal asserts when the CLK FB signal is ahead of (leads) the REF CLK signal in order to decrease the frequency produced at the VCO 108. Conversely, the DN signal asserts when the CLK FB signal is behind the REF CLK signal in order to increase the frequency produced at the VCO 108. (This may seem counter intuitive, but in the depicted embodiment, a VCO with an inverse frequency/voltage response is used, meaning that it generates higher frequencies with lower applied control voltages and vice versa.) Both the UP and DN signals substantially assert and de-assert together (with some overlap) when the CLK FB and REF CLK signals are locked (aligned with one another). The PFD can be implemented with any suitable phase detector circuit such as a flip-flop or XOR type design. In some embodiments, it is capable of operating even when the CLK FB and REF CLK signals are up to 360 degrees out of phase from one another.

Charge pump 104 is implemented with a conventional charge pump circuit. It has an analog output (VCO CTL) coupled to both the low pass filter 106 and the input of the inverse VCO 108. Based on the values of the UP and DN signals, it increases, decreases, or maintains the rate of charge provided at its output (VCO CTL). In the depicted embodiment, the low pass filter 106 is a first-order low-pass filter comprising a resistor and capacitor coupled between VCO CTL and VSS (e.g., ground). Thus, when the UP signal asserts, the charge pump 104 increases charge provided to the low pass filter 106 and thus increases the voltage level of VCO CTL. On the other hand, when the DN signal asserts, it decreases (or even may reverse) charge flow resulting in the VCO CTL voltage level declining. The low pass filter 106 serves to stabilize (e.g., filter out noise from) the VCO CTL signal. In addition, it can be used to control the bandwidth and response parameters of the PLL 100. (It should be appreciated that any suitable design could be used for the low pass filter.)

The VCO 108 generates a clock signal with a controllably adjustable frequency at its output, which is coupled to the divide-by-2 circuit 110 and to an input of the MUX 112. The frequency of the generated clock signal is based on the value of the VCO CTL signal at its input. In the depicted embodiment, a VCO with a frequency response that is inversely proportional to the input voltage is used. (It should be appreciated, however, that any suitable VCO, with or without a proportional or inversely proportional frequency/voltage characteristic could be implemented, with the UP/DN signals being appropriately configured. Likewise, as used herein, the term: VCO refers to and encompasses any controllable oscillator circuit that may be used in a PLL circuit, regardless of whether it is actually controlled by a voltage, current or some other signal form.) In the depicted embodiment, a replica bias VCO is used. It could be a conventional replica bias VCO or alternatively, it could be implemented with an adjustably capacitively loaded replica bias VCO such as the one shown in FIG. 3.

The generated VCO clock signal is provided from the VCO output to one of the MUX 112 inputs and also to the input of the divide-by-2 circuit 110, whose output is coupled to the other input of the MUX. The divide-by-2 circuit is a frequency reducing circuit that is controllably coupled by the MUX 112 from the VCO output to the PLL clock output. (A "frequency reducing circuit" refers to any circuit, digital, analog, or combination thereof, that receives at its input a signal and generates at its output a version of the signal but with a reduced frequency. A "divide-by" circuit is a frequency reducing circuit that generates at its output a version of the signal at its input but with its frequency reduced by a divided value. For example, a divide-by-2 circuit provides at its output the signal at its input but with half the frequency. The divided-out value may be fixed or it may be controllably changeable or programmable. As used herein, the term: "controllably coupled" means configured to be coupled, decoupled or coupled/decoupled to an adjustable degree based upon the state(s) of one or more control signals. Any suitable device or device combination, e.g., implementing a gate, switch, multiplexer, supply switch, or the like, may be used to controllably couple a circuit element to another circuit element.) A signal (DIV2 EN) is coupled to the multiplexer 112 from the output of the comparator 120 to select, to be passed through the multiplexer 112, either the generated clock signal from the VCO 108 or from the divide-by-2 circuit 110.

The generated clock signal from the multiplexer is coupled to the output driver 114, which is a conventional driver circuit. It serves to amplify the signal making it operably available for one or more downstream circuits. The generated output clock signal is also fed back to the CLK FB input of the PFD 102 through the divide-by-N circuit 116. The divide-by-N circuit, based on the value of N as set by control signal (NVAL), generates an output signal with a frequency that is N times less than the generated clock at its input. In this way, the generated PLL output clock (CLK OUT) has a frequency that is forced to be N times greater than the reference clock signal (REF CLK). For example, if the reference clock has a frequency of 100 MHz, the generated output clock would have a frequency of 1 GHz.

The lock detector 118, based on the monitored values of UP and DN, provides at its output a digital (LOCK) signal that indicates whether the generated output clock signal is "locked" (sufficiently tracking) the reference clock signal. It could be implemented with any suitable circuit to perform this function. For example, it could comprise a low pass filter at the output of each of the UP and DN signals, with their outputs coupled to inputs of an OR gate and a timer to monitor the output of the OR gate. The filters could be set to have suitable frequency thresholds, e.g., 100 to 200 psec, to pass only signal pulses with sufficient durations. When the output is deasserted for a sufficient continuous amount of time (both the UP and DN pulses are sufficiently small implying that the generated clock is sufficiently tracking the reference clock), the output of the lock detector 118 asserts indicating that the PLL is locked.

The lock detector 118 output is coupled to the comparator 120 to enable it when the PLL is locked. The comparator 120 comprises an analog comparator circuit that compares the VCO control voltage (VCO CTL) level with a reference voltage (VREF). If the control voltage is more than the reference voltage (implying that the VCO bias level is too low), then the comparator output is asserted to select the divide-by-2 circuit output at the multiplexer 112. The PLL is re-locked with the VCO now forced to output a frequency twice as large as what it had been generating. This results in the PLL operating at the required target frequency but with a more strongly biased VCO with reduced phase error and jitter.

The choice of VREF may be decided based on pre-characterization or after silicon debug to ensure that it is set correctly. FIG. 1 shows the concept with only one divide-by-2 circuit. However, in practice, for example, more than one divide-by-2 circuit or a controllably changeable divide-by-N circuit could be added and the process could be repeated until a desired bias is reached.

Figure 2:
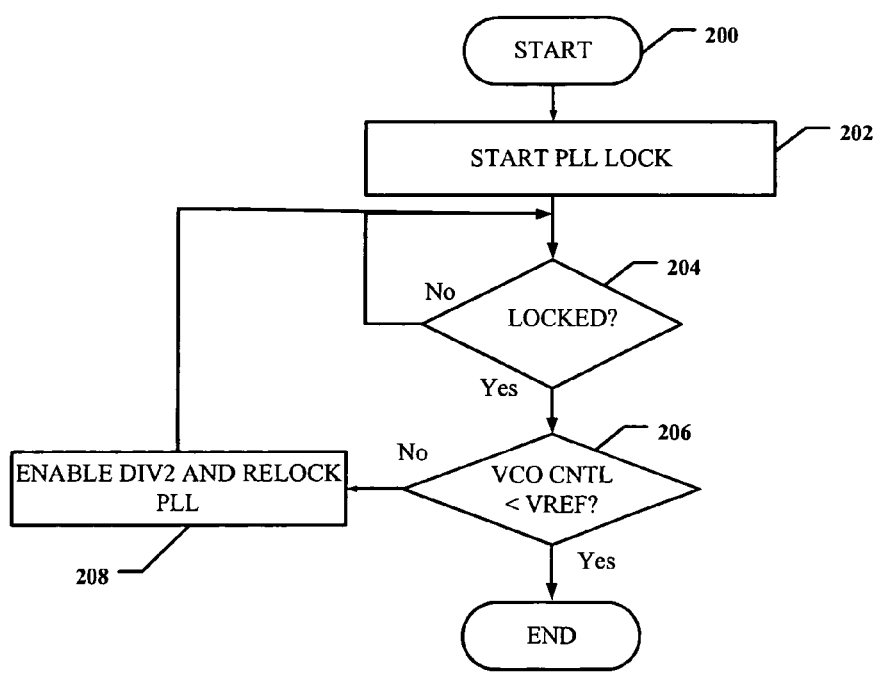
FIG. 2 is a flow diagram of a routine for controlling VCO bias in a PLL according to some embodiments.

FIG. 2 shows a flow diagram of a routine 200 for controlling VCO bias in a circuit such as PLL 100 according to some embodiments. Initially, at 202, the PLL is started. At 204, it is determined whether or not the PLL is locked. If not, the routine loops upon itself at 204 to wait until it becomes locked.

At 206, it determines whether the VCO control voltage is less than the reference voltage. If yes (implying that the VCO is suitably biased), the PLL is locked with suitably biased VCO and no further or additional divide by is required. On the other hand, if the control voltage is not less than the reference voltage (implying that the VCO is not sufficiently biased), then it proceeds to 208 where the divide-by-2 circuit is activated, and the PLL is relocked. From here, the routine loops back to 204 and proceeds as described. (Note that this routine assumes that additional divide-by capability is not necessarily available. If additional divide-by capability is available, the routine could, for example, loop back to 204 and proceed as described.)

With the preceding embodiments, the frequency between the VCO and PLL output is reduced (e.g., with divide-by circuitry) in order to force the VCO to generate a higher frequency and operate at a stronger bias level. While divide-by circuitry is used in these embodiments, any other suitable circuit or circuit combination to reduce the post VCO/pre PLL output frequency could also be used and is within the scope of the present invention. In the following sections, another approach, which may be used independently or in cooperation with the previously discussed technique, is presented. In some embodiments, this approach generally involves using a novel VCO with variable resistive and capacitive loading making it tuneable to operate at sufficient bias levels.

Figure 3:
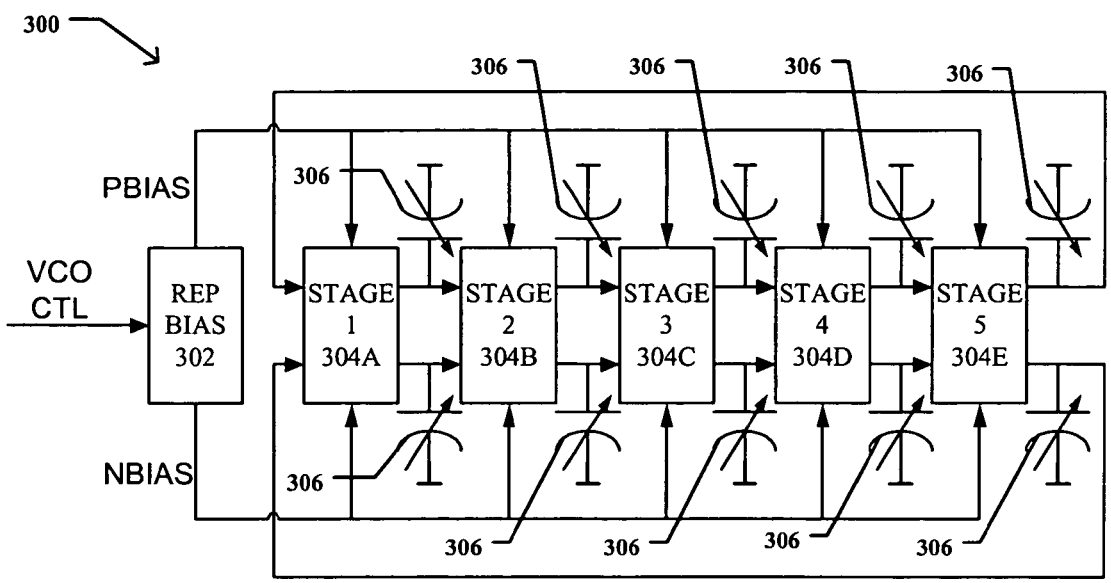
FIG. 3 is a schematic diagram of a VCO according to some embodiments.

FIG. 3 shows a 5-stage replica bias type VCO 300 with variable capacitive loading. It generally includes a replica bias section 302 with PBIAS and NBIAS outputs, differential VCO stages (e.g., ring oscillator stages) 304A to 304E, and variable capacitive loads 306, all coupled to one another as shown. The replica bias section 302 generates the PBIAS and NBIAS bias voltages in response to the input VCO CTL voltage level. The PBIAS voltage (or current) is proportional to the VCO CTL voltage level, while the NBIAS level is inversely proportional to the VCO CTL level. For example, with VCO CTL=0.3 V, PBIAS might be at 0.3 V and NBIAS might be at 0.6 V, and with VCO CTL at 0.6 V, the PBIAS would be at 0.6 with the NBIAS at 0.3 V. Thus, when the VCO CTL voltage is relatively low, the VCO stages are biased more strongly with smaller loads, which causes the VCO to output a relatively large frequency. Conversely, when the VCO CTL voltage is relatively large, the stages are biased relatively weakly and have larger loads resulting in a lower output frequency.

The variable capacitors 306 can be controlled or programmed to adjust the frequency response (FV curve) of the VCO so that it requires a sufficient bias level to operate at a desired output frequency. The variable capacitors could be implemented with capacitor banks controllably coupled to the VCO stages through switches (e.g., transistors) for adjusting the capacitive loads dynamically to achieve a sufficient bias level at an operating frequency. Alternatively, they could be coupled through preset devices such as antifuses, which could be programmed (burned), for example, after a chip is manufactured to provide it with a suitable capacitive load. In the next section, an exemplary VCO stage with dynamically adjustable resistive and capacitive loads that change in response to the VCO control voltage is discussed.

Figure 4:
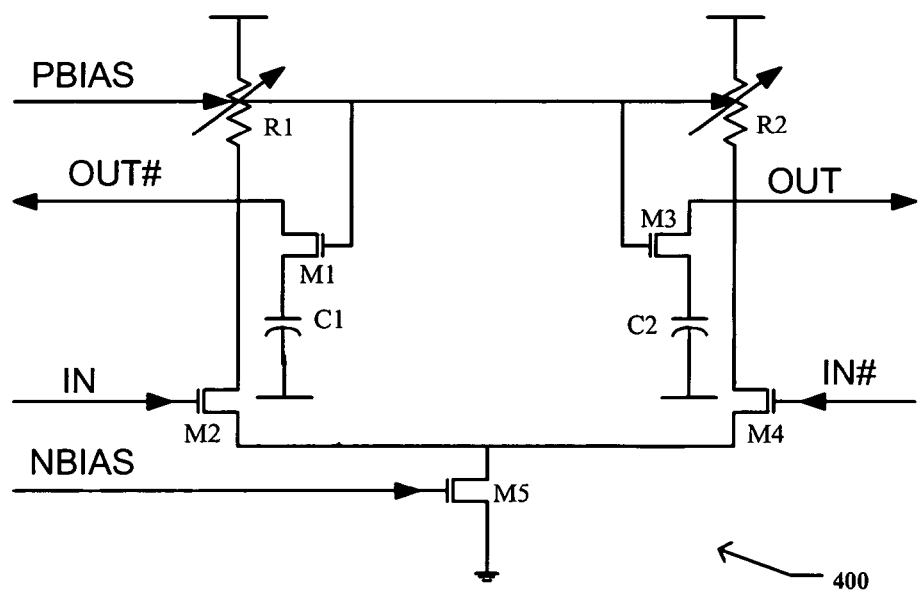
FIG. 4 is a schematic diagram of a delay stage for a VCO such as the VCO of FIG. 3 according to some embodiments.

FIG. 4 shows a differential VCO stage 400 with dynamic variable capacitive loading in accordance with some embodiments. This VCO stage 400 could be used as a stage in the VCO 300 shown in FIG. 3, although it includes variable capacitive loads and thus, the variable capacitor loads 306 in VCO 300 could be omitted if desired. VCO stage 400 generally comprises variable resistive (e.g., p-type) loads R1, R2, differential input transistors M2, M4, current source transistor M5, capacitive load transistors M1, M3, and capacitors C1 and C2, all coupled to one another as shown. The capacitive load transistors M1, M3, serve to controllably couple load capacitors C1 and C2 as loads to the differential stage.

When the PBIAS level is high and the NBIAS level is low, the resistive loads R1, R2 will be relatively weak (large resistance) with the capacitive load transistors turning on to couple the capacitors C1, C2 to the output load. With high load resistance and capacitance, the VCO stage will be tuned to a relatively low frequency. At the same time, the NBIAS level is low, so the current source M5 turns on at a relatively weak level, which provides less bias strength for supporting a relatively large output frequency. Thus, the generated output frequency will be relatively low. On the other hand, as PBIAS goes down and NBIAS goes up, the load resistance/capacitance goes down providing for higher tuned frequencies. The current source M5 turns on harder and thus, the output frequency gets higher.

Thus, the capacitors C1 and C2, in combination with transistors M1 and M3 and variable resistors R1 and R2, provide dynamic resistive and capacitive loads. They serve to increase the required bias level to attain a given frequency. Depending upon the selected capacitor values, the frequency response can be structured to provide a suitable frequency range operating over sufficient bias levels.

Figure 5:
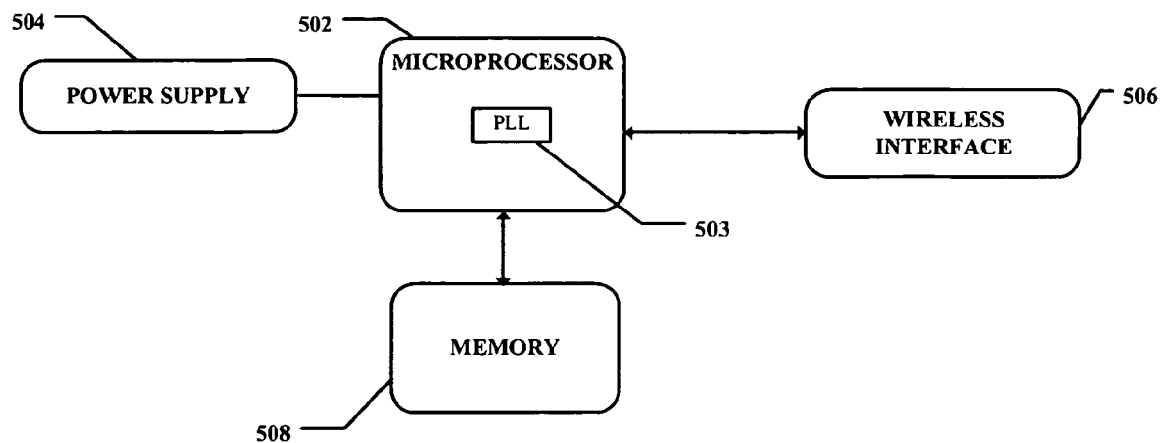
FIG. 5 is a block diagram of a computer system with a PLL according to some embodiments.

With reference to FIG. 5, one example of a computer system is shown. The depicted system generally comprises a processor 502 that is coupled to a power supply 504, a wireless interface 506, and memory 508. It is coupled to the power supply 504 to receive from it power when in operation. It is coupled to the wireless interface 506 and to the memory 508 with separate point-to-point links to communicate with the respective components. It also includes one or more PLL circuits 503 configured in accordance with a PLL disclosed herein. The wireless interface serves to communicatively link it with a wireless network such as through a wireless router. The PLL may be used to provide a clock signal to one or more circuits within the microprocessor.

It should be noted that the depicted system could be implemented in different forms. That is, it could be implemented in a single chip module, a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip, comprising:
   a PLL circuit comprising a VCO with a VCO output to provide a VCO out signal with a VCO output frequency, and a PLL output to provide a PLL output signal with a PLL output frequency;
   a frequency reducing circuit controllably coupled between the VCO output and the PLL output to cause the VCO output frequency to be greater than the PLL output frequency to operate the VCO at a higher bias level after a determination that it would otherwise operate at an insufficient bias level; and
   a comparator circuit to monitor the bias level of the VCO and enable the frequency reducing circuit when said bias level is insufficient.

2. The chip of claim 1, comprising at least one driver coupled between the frequency reducing circuit and the PLL output.

3. The chip of claim 1, in which the frequency reducing circuit comprises a divide-by circuit.

4. The chip of claim 3, in which the divide-by circuit comprises one or more divide-by-2 circuits.

5. The chip of claim 1, in which the bias level is to be monitored by comparing a control voltage applied to the VCO with a reference voltage.

6. The chip of claim 1, comprising a lock detector circuit coupled to the PLL circuit and comparator circuit to enable the comparator circuit when the PLL is locked in order to enable the frequency reducing circuit.

7. The chip of claim 1, in which the VCO comprises one or more variable resistive and capacitor loads.

8. A chip, comprising:
   a PLL having an output to provide a PLL output clock at a target frequency and a VCO to generate a clock to be used to generate the PLL output clock;
   circuitry to operate the VCO at or above a predefined bias level if the bias level would otherwise be less than the predefined bias level in the generation of the target frequency, wherein the circuitry comprises a frequency reducing circuit having one or more divide-by-2 circuits controllably coupled between the VCO and PLL output to be enabled when the VCO bias level is less than the predefined level; and a comparator circuit to monitor the VCO bias level and enable the frequency reducing circuit when said bias level is less than the predefined level.

9. The chip of claim 8, in which the circuitry comprises one or more dynamically variable resistive and capacitive loads associated with the VCO.

10. The chip of claim 8, in which the bias level is to be monitored by comparing a control voltage applied to the VCO with a reference voltage.

11. The chip of claim 8, in which the circuitry comprises one or more programmably enabled capacitor loads associated with the VCO.

* * * * *